(12) United States Patent
Barrow et al.

(10) Patent No.: US 6,624,995 B2
(45) Date of Patent: Sep. 23, 2003

(54) SEMICONDUCTOR DEVICE AND METHOD OF ACTIVATING A PROTECTION CIRCUIT WITH A SAMPLING PULSE

(75) Inventors: Steven M. Barrow, Gilbert, AZ (US); Jade H. Alberkrack, Tempe, AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 396 days.

(21) Appl. No.: 09/811,271

(22) Filed: Mar. 19, 2001

(65) Prior Publication Data

US 2002/0131225 A1 Sep. 19, 2002

(51) Int. Cl.[7] .................................................. H02H 5/04
(52) U.S. Cl. ........................ 361/103; 361/93.8; 361/111
(58) Field of Search ................................. 361/103, 111, 361/93.8, 100, 101

(56) References Cited

U.S. PATENT DOCUMENTS 6,052,268 A * 4/2000 Thomas ....................... 361/103

* cited by examiner

*Primary Examiner*—Stephen W. Jackson
*Assistant Examiner*—James A Demakis

(57) ABSTRACT

A semiconductor device (10) includes a protection circuit (12) that has an input (24) for activating the protection circuit in response to a sampling pulse ($V_{ENABLE}$) to detect a fault condition of the semiconductor device, and an output (30) for producing a control signal ($V_{CONTROL1}$) when a fault condition is detected.

21 Claims, 1 Drawing Sheet

SEMICONDUCTOR DEVICE AND METHOD OF ACTIVATING A PROTECTION CIRCUIT WITH A SAMPLING PULSE

BACKGROUND OF THE INVENTION

The present invention relates in general to semiconductor devices and, more particularly, to integrated circuits that include protection circuitry to detect fault conditions that occur in the integrated circuits.

Many electronic systems utilize integrated circuits that include fault protection circuits that detect and correct fault conditions of the integrated circuits in order to avoid component damage. For example, some integrated voltage regulators include thermal shutdown, overvoltage protection and/or current limiting circuits to prevent damage to the regulator when operated outside of its specified operating range. Fault protection circuitry monitors an operating condition of the integrated circuit and, if a fault condition is detected, produces a control signal that can be used to initiate corrective action such as shutting down the integrated circuit or reducing its current.

Previous fault protection circuits have a disadvantage in that they consume a relatively high current. Therefore, some battery operated systems such as cellular telephones or digital cameras, where a long period between battery recharging or replacement is essential, often do not include fault protection circuits in their integrated circuits. As a consequence, these systems are less reliable than systems that use such fault protection circuits.

Hence, there is a need for an integrated circuit that operates at a low current level and which includes low current protection circuitry to avoid damaging the integrated circuit.

DETAILED DESCRIPTION OF THE DRAWINGS

In the figures, elements having the same reference numbers have similar functionality.

Figure 1:
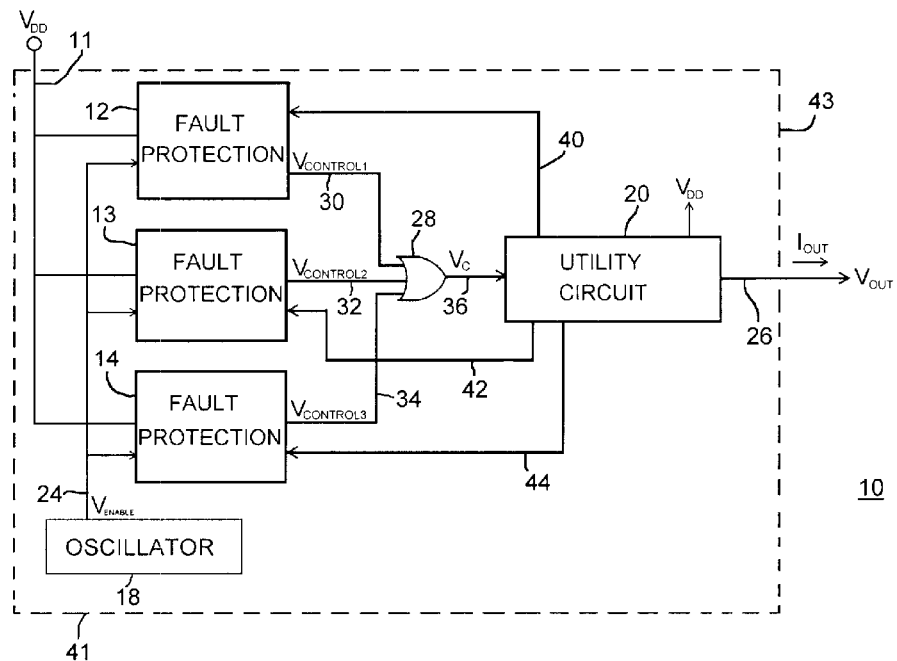
FIG. 1 is a block diagram of an integrated circuit including fault protection circuitry.

FIG. 1 is a block diagram of an integrated circuit 10, including fault protection circuits 12–14, an oscillator 18, OR gate 28 and a utility circuit 20 formed on a semiconductor substrate 41 and housed in an integrated circuit package 43. In one embodiment, integrated circuit 10 has a supply electrode 11 for operating in a battery operated system at a supply voltage $V_{DD}$=12.0 volts. Hence, integrated circuit 10 has a low current drain in order to provide a long operating time between battery recharging or replacement.

Utility circuit 20 is formed on substrate 41 and configured to provide an analog or digital function of integrated circuit 10, such as an amplifier, a dual comparator, a voltage regulator, a logic circuit, and the like. An output stage that drives an output 26 with an output signal $V_{OUT}$ which may be an analog or a digital signal depending on the application. The output stage supplies an output current $I_{OUT}$ to a system load (not shown). An input is coupled to node 36 for receiving a shutdown or deactivation signal $V_C$ when a fault condition of utility circuit 20 is detected. $V_C$ has a logic low value during normal operation and a logic high value when a fault condition is detected.

A fault condition is designated as a condition which exceeds the specified operating range and which, if uncorrected, can result in damaging integrated circuit 10. For example, in one embodiment a fault condition arises when the local temperature of a region of substrate 41 exceeds a predetermined value. Alternatively, a fault condition results from an overvoltage on node 26 which can damage the output stage of utility circuit 20. Similarly, a system malfunction or a short circuit that causes an overcurrent condition of $I_{OUT}$ which could damage the output stage of utility circuit 20 can be referred to as a fault condition.

Integrated circuit 10 is shown as having three fault protection circuits 12–14, but may include either fewer or more as is appropriate for the application. Fault protection circuits 12–14 typically are disposed on substrate 41 in locations where a fault condition is likely to occur, such as adjacent to a device with a high power dissipation or one susceptible to an overvoltage or overcurrent condition. To conserve power, fault protection circuits 12–14 are operated a significant portion of the time in a low current standby mode during which no fault monitoring occurs. When an activation or sampling signal $V_{ENABLE}$ is received from a node 24, fault protection circuits 12–14 switch from the standby mode to a higher current active mode in order to sample or sense an operating condition of utility circuit 20.

Fault protection circuit 12 is configured as a temperature sensor which monitors the local temperature of the output stage of utility circuit 20. Fault protection circuit 12 includes a temperature sensing circuit that responds to heat flowing from utility circuit 20 along a thermal path 40 of substrate 41 to produce a sense signal representative of the local temperature. The sense signal is compared to a reference signal to produce control signal $V_{CONTROL1}$ at a node 30. When an overheating fault condition occurs, i.e., when the local temperature is greater than a predetermined level, control signal $V_{CONTROL1}$ is set to a logic high and routed through OR gate 28 as deactivation signal $V_C$ to initiate a corrective action.

Fault protection circuits 13 and 14 operate similarly but monitor other operating conditions of utility circuit 20 and produce digital control signals $V_{CONTROL2}$ and $V_{CONTROL3}$, respectively, when a fault condition is detected. The other operating conditions are received at sense inputs of fault protection circuits 13 and 14 along sense paths 42 and 44, respectively. Sense paths 42 and 44 may comprise interconnect lines, such as for current or voltage sensing, or may represent thermal paths for transferring heat.

Oscillator 18 is a free running pulse generator that produces sampling pulses $V_{ENABLE}$ for switching fault protection circuits 12–14 between standby and active modes by activating their respective supply currents. In one embodiment, oscillator 18 generates $V_{ENABLE}$ pulses at a frequency of about one kilohertz and a duty cycle of about one percent. That is, oscillator 18 produces a ten microsecond sampling pulse $V_{ENABLE}$ each millisecond, which typically is fast enough to detect significant temperature changes as they occur. Oscillator 18 operates continuously at a current of about two hundred fifty nanoamperes.

A broad variety of fault monitoring strategies can be implemented with embodiments of integrated circuit 10 while maintaining a low average current drain. For example, where it is desirable to sample different operating conditions at different intervals, integrated circuit 10 may incorporate multiple oscillators, each producing a sampling signal to activate a particular fault protection circuit. Alternatively, oscillator 18 can generate a digital clock signal in which the logic high portion activates a first fault protection circuit while the logic low portion activates a second fault protection circuit. The logic high portion can operate at a low duty cycle such as for thermal sensing while the logic low portion operates over the remainder of the clock period to provide sensing at a high duty cycle, such as for overvoltage sensing. As a further alternative, oscillator 18 may generate a phased clock so that different protection circuits are activated on different clock phases. These clock phases can be generated to have different durations in order to sample different operating conditions over different periods of time.

Logic OR gate 28 is implemented as a standard three input logic gate that performs a Boolean OR function on digital control signals $V_{CONTROL1}$, $V_{CONTROL2}$ and $V_{CONTROL3}$. An output is connected to a node 36 to produce deactivation signal $V_C$ which has a logic high value when $V_{CONTROL1}$, $V_{CONTROL2}$ or $V_{CONTROL3}$ is logic high.

Figure 2:
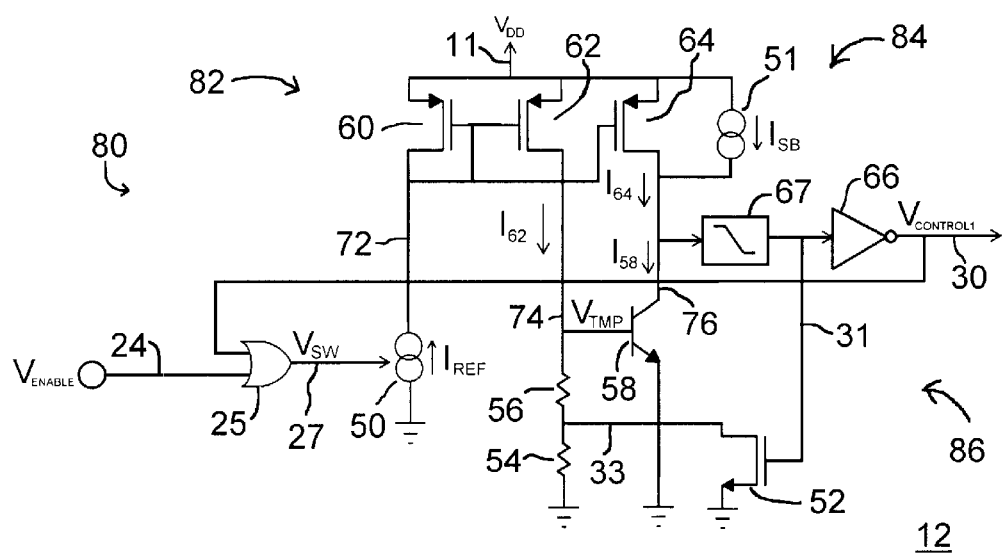
FIG. 2 is a schematic diagram showing a protection circuit in further detail.

FIG. 2 is a schematic diagram showing fault protection circuit 12 in further detail, including an activation circuit 80, a sensing circuit 82, a comparator 84 and a feedback path 86. Fault protection circuit 12 operates as a low current, local temperature sensor which produces control signal $V_{CONTROL1}$ when the local temperature rises above a predetermined level designated as a fault temperature threshold. In one embodiment, the fault threshold is set at about one hundred forty degrees Celsius.

Activation circuit 80 includes a current source 50 and a logic OR gate 25 that enable or block supply currents to switch fault protection circuit 12 between active and standby modes.

Current source 50 provides a reference current $I_{REF}$=1.0 microamperes for biasing fault protection circuit 12 and for establishing the fault temperature threshold, as described below. Current source 50 has a control electrode coupled to a node 27 for receiving a digital activation signal $V_{SW}$ to turn current $I_{REF}$ on or off. In one embodiment, $I_{REF}$ is selected to have a temperature coefficient of zero to provide a substantially constant current level over the specified temperature range.

OR gate 25 has inputs coupled to nodes 24 and 30 for performing a Boolean OR function and an output coupled to node 27 for providing activation signal $V_{SW}$ to control current source 50. When $V_{SW}$ is logic low, current source 50 is turned off and $I_{REF}$ is zero. When $V_{SW}$ is logic high, current source 50 is turned on and $I_{REF}$=1.0 microamperes.

Sensing circuit 82 includes transistors 58, 60, 62 and 64, and resistors 54 and 56. Transistors 60, 62 and 64 are standard p-channel metal-oxide-semiconductor field effect transistors which are matched or scaled to each other.

Transistor 60 operates with a diode configuration as shown to establish mirrored or scaled supply currents $I_{62}$ and $I_{64}$ through transistors 62 and 64, respectively. In one embodiment, transistors 62 and 64 are selected to be three times the size of transistor 60, so $I_{62}$=$I_{64}$=3.0 microamperes. Note that such scaling results in $I_{62}$ and $I_{64}$ having the same temperature coefficient as $I_{REF}$.

Resistors 54 and 56 are formed in substrate 41 to have resistances R54 and R56, respectively, both of which increase with temperature, i.e., have positive temperature coefficients. When fault protection circuit 12 is activated for temperature sensing, current $I_{62}$ flows through resistor 54 to develop a sense voltage $V_{TMP}$ on a node 74, while resistor 56 is effectively shorted out by a transistor 52. Once a fault condition is detected, transistor 52 turns off and $I_{REF}$ flows through both resistor 54 and resistor 56, which increases the value of $V_{TMP}$ to provide a temperature hysteresis that keeps $V_{CONTROL1}$ high until the local temperature cools to a temperature below a reset threshold. In one embodiment, R56 has a value of about eighty-seven kilohms to set the fault temperature threshold to one hundred forty degrees Celsius, while R54 has a value of about forty-three kilohms to set the reset threshold to about one hundred degrees Celsius. Note that $V_{TMP}$ increases with temperature due to the positive temperature coefficients of R54 and R56.

Transistor 58 comprises a standard NPN bipolar transistor selected to provide a sense current $I_{58}$=3.0 microamperes when sense voltage $V_{TMP}$ reaches a value indicative of the fault temperature threshold. For a given collector current $I_{58}$, the $V_{BE}$ of transistor 58 has a temperature coefficient of about minus two millivolts per degree Celsius. The negative temperature coefficient of $V_{BE}$ and the positive temperature coefficient of R54 and R56 cause $I_{58}$ to increase as the local temperature increases.

Comparator 84 includes transistors 58 and 64, and an inverter 66. Comparator 84 effectively compares current $I_{58}$ with current $I_{64}$ to determine the potential on a comparison node 76. When $I_{58}$ is less than $I_{64}$, the potential on node 76 has a logic high level substantially equal to the potential of $V_{DD}$, and when $I_{58}$ is greater than $I_{64}$, transistor 58 saturates and the potential of node 76 is reduced to a logic low level near ground potential. Inverter 66 produces control signal $V_{CONTROL1}$ at node 30 as the logic inverse of the node 76 value.

Feedback path 86 functions as a noise reduction circuit, including a low pass filter 67, a transistor 52 and OR gate 25. Noise reduction and circuit stability are achieved through signal filtering and hysteresis.

Low pass filter 67 is coupled to node 76 to filter out noise spikes that could cause false tripping of fault protection circuit 12. In one embodiment, low pass filter 67 includes circuitry to filter out noise spikes whose widths are less than about two microseconds. An output is coupled to a node 31 to provide a filtered signal for switching transistor 52, OR gate 25 and inverter 66.

Transistor 52 comprises a standard n-channel metal-oxide-semiconductor field effect transistor that functions with transistor 58 as a latch to maintain $V_{CONTROL1}$ at a high logic level when a thermal fault condition is detected. During normal operation when node 76 is high, transistor 52 is turned on to short resistor 54 to ground potential. When a fault condition occurs and node 76 is low, transistor 52 turns off to route current $I_{62}$ through both resistors 54 and 56, which increases the value of $I_{REF}$ to keep node 76 at a logic low and $V_{CONTROL1}$ at a logic high. This condition is maintained until the local temperature cools to the reset threshold so that $I_{58}$ decays to a level below that of $I_{64}$.

While control signal $V_{CONTROL1}$ is high, OR gate 25 maintains signal $V_{SW}$ at a logic high, keeping current source 50 turned on and fault protection circuit 12 in a continuously active sensing mode until the local temperature declines and normal operation is restored.

Cycles of the operation of fault protection circuit 12 are described as follows. Assume that initially $V_{ENABLE}$ is logic low and integrated circuit 10 is operating below the fault temperature threshold. Current source 50 is turned off and $I_{REF}$ is zero, so fault protection circuit 12 is operating in the standby mode with little or no current being consumed except for a standby current source 51 operating at a current $I_{SB}$=0.1 microamperes to keep node 76 high. Control signal $V_{CONTROL1}$ is logic low and current source 50 is controlled by $V_{ENABLE}$.

When sampling pulse $V_{ENABLE}$ goes high, current source 50 turns on to switch fault protection circuit 12 to the active mode by activating supply currents $I_{REF}$, $I_{62}$ and $I_{64}$. Since the local temperature is below the thermal fault threshold, current $I_{58}$ is lower than current $I_{64}$, so node 76 remains high and $V_{CONTROL1}$ remains low. During the active mode, fault protection circuit 12 consumes about eight microamperes. When sampling pulse $V_{ENABLE}$ terminates, fault protection circuit 12 is returned to the standby mode.

Assume that on the next cycle the local temperature is greater than the fault threshold, so a thermal fault condition exists. When the next sampling pulse $V_{ENABLE}$ begins, current source 50 turns on and currents $I_{REF}$, $I_{62}$ and $I_{64}$ flow as on the previous cycle. Since the fault condition causes current $I_{58}$ to flow at a level greater than current $I_{64}$, node 76 is low, which turns off transistor 52 and sets $V_{CONTROL1}$ high to signal the fault condition to utility circuit 20. $V_{CONTROL1}$ is effectively latched in a high state to keep current source 50 turned on and to maintain fault protection circuit 12 in the active mode until the temperature declines below the reset threshold, at which point $V_{CONTROL1}$ switches to a low state to end the cycle.

Depending on the rate of heat transfer through substrate 41, sampling pulses $V_{ENABLE}$ preferably are produced with a duty cycle less than ten percent, so fault protection circuit 12 draws significant current less than ten percent of the time. In one embodiment, $V_{ENABLE}$ pulses are generated with a one percent duty cycle, which results in an average supply current of less than 0.4 microamperes. In some applications, a further benefit can be achieved by sharing reference current source 50 and its reference current $I_{REF}$ among multiple protection circuits to further reduce the average current drain.

In summary, the present invention provides a semiconductor device and protection method that operates at a reduced average current level while providing a high reliability of the semiconductor device. A protection circuit is activated in response to a sampling pulse for detecting a fault condition of the semiconductor device. An output of the protection circuit produces a control signal that can initiate a corrective action such as a shutdown of the semiconductor device. The sampling pulse activates a supply current that biases the protection circuit for sensing the semiconductor device. When the sampling pulse terminates, the current is reduced to a standby level of nearly zero. Sampling pulses can be produced at a duty cycle of one percent or less, so the average current and power consumed by the protection circuit is substantially lower than previous protection circuits.

What is claimed is:

1. A semiconductor device, comprising a protection circuit having an input for activating the protection circuit with a sampling pulse to detect a fault condition of the semiconductor device, and an output for providing a control signal.

2. The semiconductor device of claim 1, further comprising an oscillator having an output coupled to the input of the protection circuit for generating the sampling pulse.

3. The semiconductor device of claim 1, wherein the protection circuit has a supply electrode for providing a supply current to activate the protection circuit.

4. The semiconductor device of claim 3, wherein the protection circuit further comprises a current source that operates in response to the sampling pulse for enabling the supply current.

5. The semiconductor device of claim 1, further comprising a semiconductor substrate for forming the protection circuit.

6. The semiconductor device of claim 5, further comprising a utility circuit formed on the semiconductor substrate, wherein the protection circuit monitors the utility circuit in response to the sampling pulse to detect the fault condition.

7. The semiconductor device of claim 6, wherein the protection circuit senses the fault condition as a temperature of the utility circuit.

8. The semiconductor device of claim 7, further comprising a thermal path through the semiconductor substrate for routing a heat flow from the utility circuit to the protection circuit.

9. The semiconductor device of claim 8, wherein the utility circuit has a control input coupled to the output of the protection circuit for deactivating the utility circuit with the control signal when the temperature is greater than a predefined level.

10. The semiconductor device of claim 1, wherein the protection circuit includes a latch coupled to the output of the protection circuit to maintain the control signal constant until the fault condition terminates.

11. The semiconductor device of claim 1, further comprising a package for housing the protection circuit.

12. A method of protecting a semiconductor device, comprising the step of activating a protection circuit with a sampling pulse to detect a fault condition of the semiconductor device.

13. The method of claim 12, wherein the step of activating includes the step of switching a supply current to the protection circuit with the sampling pulse.

14. The method of claim 13, further comprising the step of turning off the supply current when the sampling pulse terminates.

15. The method of claim 12, wherein the step of activating includes the step of monitoring a utilization circuit to detect the fault condition.

16. The method of claim 15, wherein the step of activating further includes the step of sensing a heat flow through a semiconductor substrate to detect the fault condition as a temperature of the utilization circuit.

17. The method of claim 15, further comprising the step of deactivating the utilization circuit with a control signal when the fault condition is detected.

18. An integrated circuit, comprising:

a semiconductor substrate;

a utility circuit formed on the semiconductor substrate to perform a function of the integrated circuit; and a protection circuit formed on the semiconductor substrate to operate with a supply current that is enabled with a sampling pulse to monitor a condition of the utility circuit, and having an output for providing a control signal when a fault condition of the utility circuit is detected.

19. The integrated circuit of claim 17, where the utility circuit has a control input for receiving the control signal.

20. The integrated circuit of claim 18, further comprising an oscillator having an output coupled to an input of the protection circuit for generating the sampling pulse.

21. The integrated circuit of claim 20, wherein the oscillator produces the sampling pulse with a duty cycle of less than about ten percent.

* * * * *